(12) United States Patent
Lent et al.

(10) Patent No.: US 9,253,875 B2
(45) Date of Patent: Feb. 2, 2016

(54) ISOLATING DIFFERENTIAL TRANSMISSION LINES

(71) Applicant: Intel IP Corporation, Santa Clara, CA (US)

(72) Inventors: Lillian Lent, Chandler, AZ (US); Chi-Taou Tsai, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 81 days.

(21) Appl. No.: 13/895,101

(22) Filed: May 15, 2013

(65) Prior Publication Data

US 2014/0341581 A1  Nov. 20, 2014

(51) Int. Cl.
*H05K 1/02* (2006.01)
*H04B 3/32* (2006.01)
*H04B 10/2507* (2013.01)
*H01L 23/66* (2006.01)
*H01P 3/02* (2006.01)

(52) U.S. Cl.
CPC .............. *H05K 1/0245* (2013.01); *H01L 23/66* (2013.01); *H01P 3/026* (2013.01); *H04B 3/32* (2013.01); *H04B 10/2507* (2013.01); *H01L 2223/6638* (2013.01); *H01L 2924/0002* (2013.01)

(58) Field of Classification Search
CPC ............ H05K 1/0245; H01P 3/02; H01P 3/04
USPC ......................................................... 333/4, 5
See application file for complete search history.

(56) References Cited

U.S. PATENT DOCUMENTS

| 3,757,028 | A | * | 9/1973 | Schlessel | ........................ 174/33 |
| 3,942,164 | A | | 3/1976 | Dunn | |
| 5,994,946 | A | | 11/1999 | Zhang | |
| 6,433,272 | B1 | * | 8/2002 | Buhler et al. | ................... 174/27 |
| 7,830,221 | B2 | * | 11/2010 | Merritt | .............................. 333/1 |
| 2010/0200276 | A1 | * | 8/2010 | Karikalan | ..................... 174/250 |
| 2012/0275122 | A1 | | 11/2012 | Howard et al. | |
| 2014/0152384 | A1 | | 6/2014 | Rofougaran | .................. 327/565 |

OTHER PUBLICATIONS

German Office Action issued in Appl. No. DE 10 2014 106 597.2 (w/ English Translation), 15 pages, Oct. 28, 2014.
Office Action (with English translation) issued in Application No. JP 2014-100928, 9 pages, May 12, 2015.

* cited by examiner

*Primary Examiner* — Benny Lee
(74) *Attorney, Agent, or Firm* — Baker Botts L.L.P.

(57) ABSTRACT

An apparatus includes a first differential transmission line and a second differential transmission line. The second differential transmission line is parallel to the first differential transmission line through an overlap region. The first differential transmission line includes a first line and a second line. The first differential transmission line includes N crossovers along the first differential transmission line through the overlap region at which the first line and the second line switch lanes with each other. N is equal to $1+\text{INT}\{L/(\lambda/C)\}$, where L is a length of the overlap region, $\lambda$ is a wavelength of a differential signal carried by the first or second differential transmission line, C is a constant, and $\text{INT}\{L/(\lambda/C)\}$ is $\{L/(\lambda/C)\}$ rounded down to the nearest integer.

18 Claims, 8 Drawing Sheets

ISOLATING DIFFERENTIAL TRANSMISSION LINES

FIELD

The embodiments discussed herein are related to isolating differential transmission lines.

BACKGROUND

Transceiver or radio frequency (RF) integrated circuits (ICs) often have one or more differential transmission lines carrying clock and/or voltage-controlled oscillator (VCO) signals over most or all of the length and/or width of the IC. Differential transmission lines are susceptible to noise from nearby circuitries and/or interconnections, which could potentially cause de-modulation, crosstalk, and spurs that may negatively affect differential signals carried on the differential transmission lines.

In a specific example involving carrier aggregation, two differential transmission lines may be placed side-by-side on an IC, where the differential transmission lines carry VCO signals with different frequencies to different transmitter/receive (TX/RX) mixers. Because the differential transmission lines are located near each other, a high degree of unwanted coupling may occur between the signals carried by the differential transmission lines without sufficient isolation.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE INVENTION

According to an aspect of an embodiment, an apparatus includes a first differential transmission line configured to carry a first differential signal and a second differential transmission line configured to carry a second differential signal. The second differential transmission line is parallel to the first differential transmission line through an overlap region. The first differential transmission line includes a first line and a second line. The first differential transmission line includes N crossovers along the first differential transmission line through the overlap region at which the first line and the second line switch lanes with each other. N may be equal to $1+\text{INT}\{L/(\lambda/C)\}$, where L is a length of the overlap region, $\lambda$ is a wavelength of the first differential signal or the second differential signal having the highest frequency of the first differential signal or the second differential signal, C is a constant, and $\text{INT}\{L/(\lambda/C)\}$ is $\{L/(\lambda/C)\}$ rounded down to the nearest integer.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION OF PREFERRED EMBODIMENTS

Figure 1:
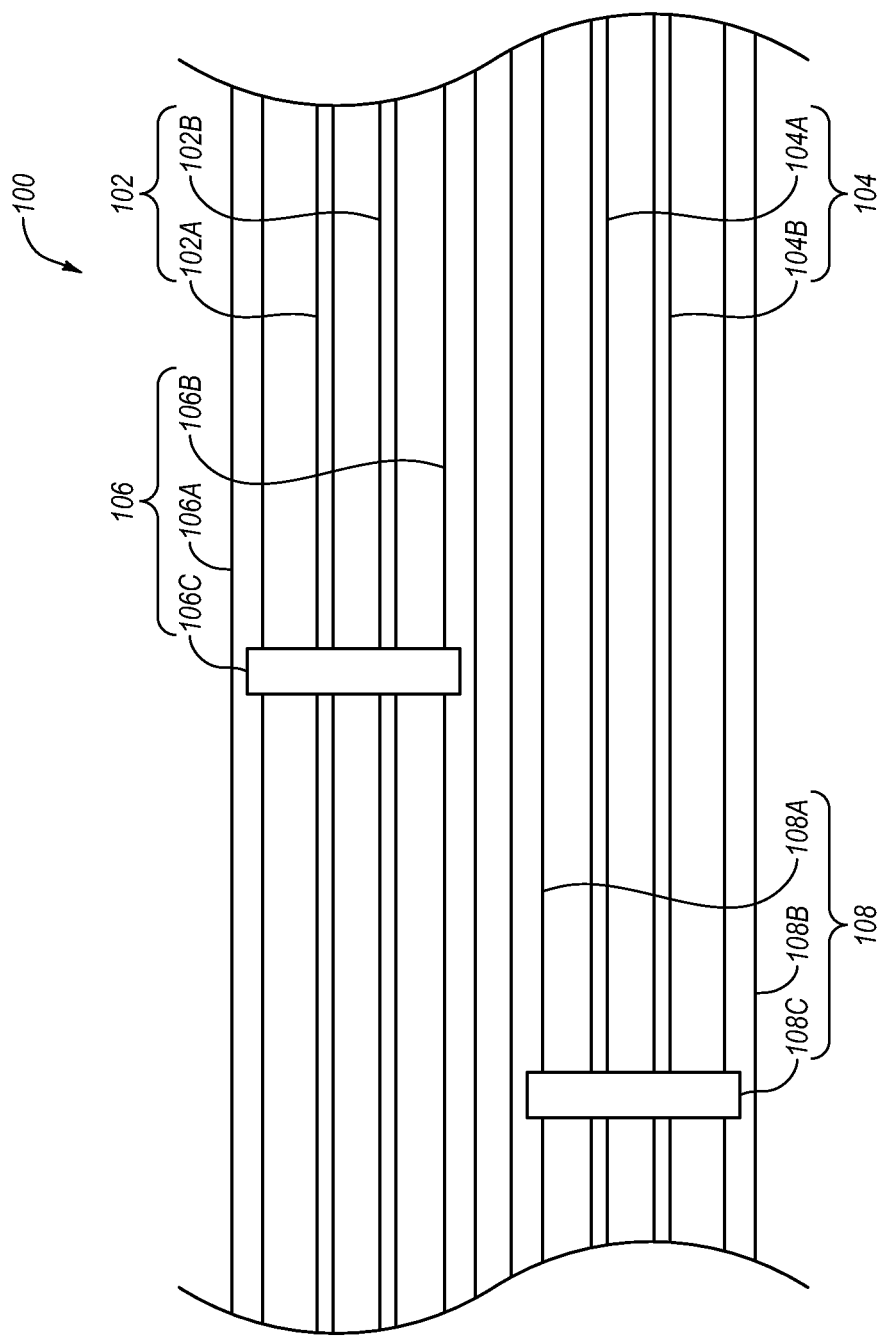
FIG. 1 illustrates a conventional apparatus with multiple differential transmission lines.

FIG. 1 illustrates a conventional apparatus 100 with multiple differential transmission lines 102, 104. Each differential transmission line 102 and 104 is configured to carry a differential signal. Accordingly, each differential transmission line 102 and 104 includes a pair of conductors, including a respective positive line 102A or 104A on which a positive component of a corresponding differential signal is carried, and a respective negative line 102B or 104B on which a negative component of the corresponding differential signal is carried.

There is typically signal coupling between differential transmission lines that are nearby each other. The signal coupling between parallel differential transmission lines 102, 104 is a function of the distance between the two and the differential signal on each. Accordingly, in the apparatus 100 of FIG. 1 where the differential transmission lines 102, 104 are adjacent to each other, there may be signal coupling between the differential transmission lines 102, 104.

FIG. 1 further illustrates a known differential transmission line isolation scheme that attempts to reduce signal coupling between the differential transmission lines 102, 104. In particular, a respective ground shield 106 or 108 is provided including a ground line 106A, 106B, 108A, or 108B on the corresponding one side of each of the differential transmission lines 102, 104. In more detail, the ground shield 106 for the differential transmission line 102 includes a first ground line 106A on one side of the differential transmission line 102 and a second ground line 106B on the other side of the differential transmission line 102. The ground shield 108 for the differential transmission line 104 includes a first ground line 108A on one side of the differential transmission line 104 and a second ground line 108B on the other side of the differential transmission line 104.

As illustrated, each of the ground shields 106, 108 additionally includes conductive bridges 106C or 108C configured to balance the potential across the two ground lines 106A and 106B or 108A and 108B of the ground shield 106 or 108, and to suppress undesirable higher order modes which could be induced in the corresponding differential transmission line 102 or 104. Each ground shield 106, 108 may include multiple conductive bridges 106C, 108C spaced along the length of the respective ground shield 106 or 108. For instance, conductive bridges 106C, 108C may be spaced every few hundred micrometers (μm).

While ground-shielded differential transmission lines may have better isolation compared to non-ground shielded differential transmission lines, ground-shielding may be insufficient as signaling rates increase and/or in other circumstances.

U.S. Patent Publication 2012/0275122A1 to Howard discloses an approach to reducing cross-talk in parallel differential transmission lines. According to Howard, a "plurality of pairs of differential transmission lines includes a set of pairs of differential transmission lines with each pair of differential transmission lines from the set of pairs of differential transmission lines including at least one twist to alternate current direction. Also, the plurality of differential transmission lines are arranged such that alternating current directions substantially eliminate cross-talk across the plurality of pairs of differential transmission lines." See Howard at Abstract.

The Howard approach relies on orthogonality and the following equation:

$$\varphi_{i[n],j[m]} \propto 1/r_{eff} = 1/l_{j[m]} l_{i[n]} \int_{l_{j[m]}} \int_{l_{i[n]}} (l_{i[n]}) i_{j[m]} (l_{j[m]})/r_{i[n],j[m]} dl_{j[m]} dl_{i[n]} \quad (2)$$

The orthogonality assumes the current flowing in paired positive and negative lines is equal in magnitude but opposite in direction. See Howard at paragraph [0024]. The orthogonality also assumes that the twist causes the positive and negative lines to swap position. As such, integrating over the entire length of the paired positive and negative lines using equation (2) above yields complete cancellation of signal coupling from neighboring positive and negative lines if the twists are placed as described in Howard.

However, the approach described in Howard is only valid if all differential transmission lines are "reasonably short lines (i.e., less than 1/10 of a wavelength)." Howard at paragraph [0027]. If the differential transmission lines are longer than 1/10 of a wavelength in RF applications with sinusoidal signals, there will be phase shifts. Accordingly, complete cancellation of the current in paired positive and negative lines over the entire length of the pair is not realized because of the phase difference among all the current components along the length of the pair and the approach described in Howard breaks down.

Some embodiments described herein, however, relate to isolating differential transmission lines in RF applications where the length of the differential transmission lines is greater than 1/10 of a wavelength of the differential signal carried by the corresponding differential transmission line. Example embodiments include differential transmission lines with crossovers in one or both of the differential transmission lines, at least within an overlap region within which the differential transmission lines are parallel to each other.

A number of crossovers to include in at least one of the differential transmission lines may be determined based on a wavelength (or frequency) of a differential signal carried in one of the differential transmission lines and on a length of an overlap region in which the differential transmission lines are parallel to each other. The number of crossovers may be determined as described in more detail below so as to improve isolation without excessively increasing insertion loss.

Embodiments of the present invention will be explained with reference to the accompanying drawings. It is to be understood that the drawings are diagrammatic and schematic representations of such example embodiments, and are not limiting of the present invention, nor are they necessarily drawn to scale.

Figure 2:
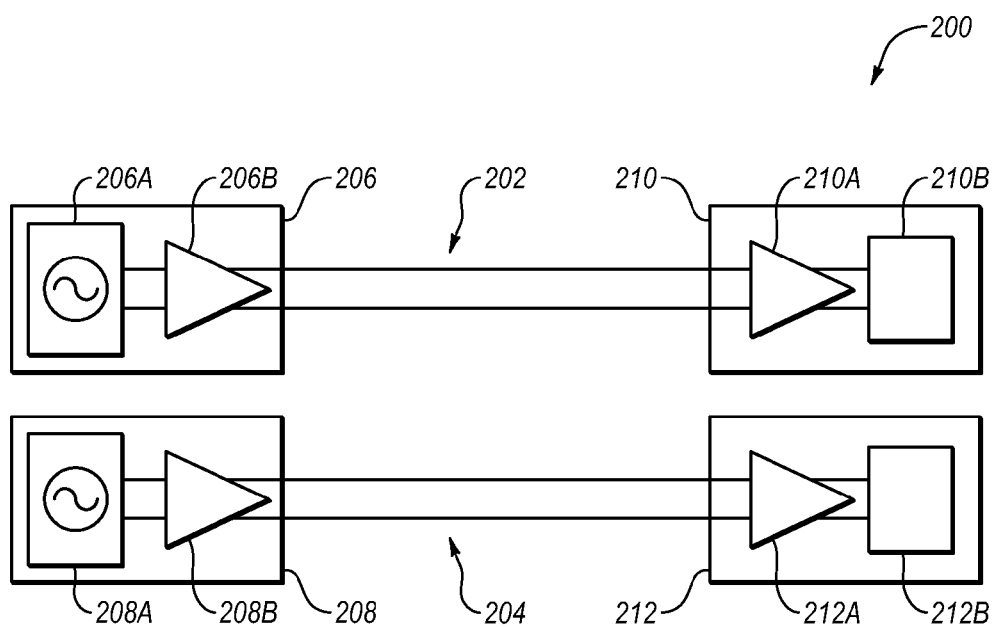
FIG. 2 illustrates an example system in which some embodiments described herein may be implemented.

FIG. 2 illustrates an example system 200 in which some embodiments described herein may be implemented. The system 200 may be implemented as a transmitter, a receiver, a transmitter and receiver (transceiver), or more generally any electronics system including two or more parallel differential transmission lines. In the illustrated embodiment, the system 200 includes two differential transmission lines 202, 204, each communicatively coupling a respective differential transmission source 206 or 208 to a corresponding differential transmission load 210 or 212. By way of example, but not limitation, one or both of the differential transmission sources 206 or 208 may include a local oscillator (LO) 206A or 208A and/or an LO buffer 206B or 208B while one or both of the differential transmission loads 210 or 212 may include a buffer 210A or 212A and a transmitter/receive (TX/RX) mixer 210B or 212B.

Each of the differential transmission lines 202, 204 may carry a differential signal in the RF range. For example, in some embodiments, each differential signal may have a frequency of at least 900 megahertz (MHz), such as a frequency in a range from about 900 MHz to about 15 gigahertz (GHz). As such, each differential signal may have a wavelength of not more than 22 centimeters, such as a wavelength in a range from about 1.3 cm to about 22 cm. Each of the differential transmission lines 202, 204 may have a length that is at least 1/10 the wavelength of the differential signal carried thereon. For instance, suppose the differential transmission line 202 carries a differential signal having a frequency of 6 GHz and a wavelength of 3.3 cm. In this example, the differential transmission line 202 may have a length of at least 3.3 mm.

In addition, the differential transmission lines 202, 204 may be parallel and nearby each other at least within an area of the system 200 referred to as an overlap region, as described in more detail below. The term "parallel" may be broadly construed to include exactly parallel and substantially parallel. In some embodiments, two or more parallel differential transmission lines may be considered "nearby" each other if they are sufficiently close to cause at least some degree of signal coupling in the absence of at least one differential transmission line isolation scheme. Although not illustrated in FIG. 2, at least one of the differential transmission lines 202, 204 may include one or more crossovers at least in the overlap region to mitigate the effects of signal coupling. A number of crossovers included in one or both of the differential transmission lines 202, 204 may be determined consistent with the embodiments disclosed herein.

Modifications, additions, or omissions may be made to the system 200 without departing from the scope of the present disclosure, For example, one or both of the differential transmission sources 206, 208 may include different and/or additional components than the LOs 206A, 208A and/or LO buffers 206B, 208B. Analogously, one or both of the differential transmission loads 210, 212 may include different and/or additional components than the buffers 210A, 212A and/or TX/RX mixers 210B, 212B.

Figure 3A:
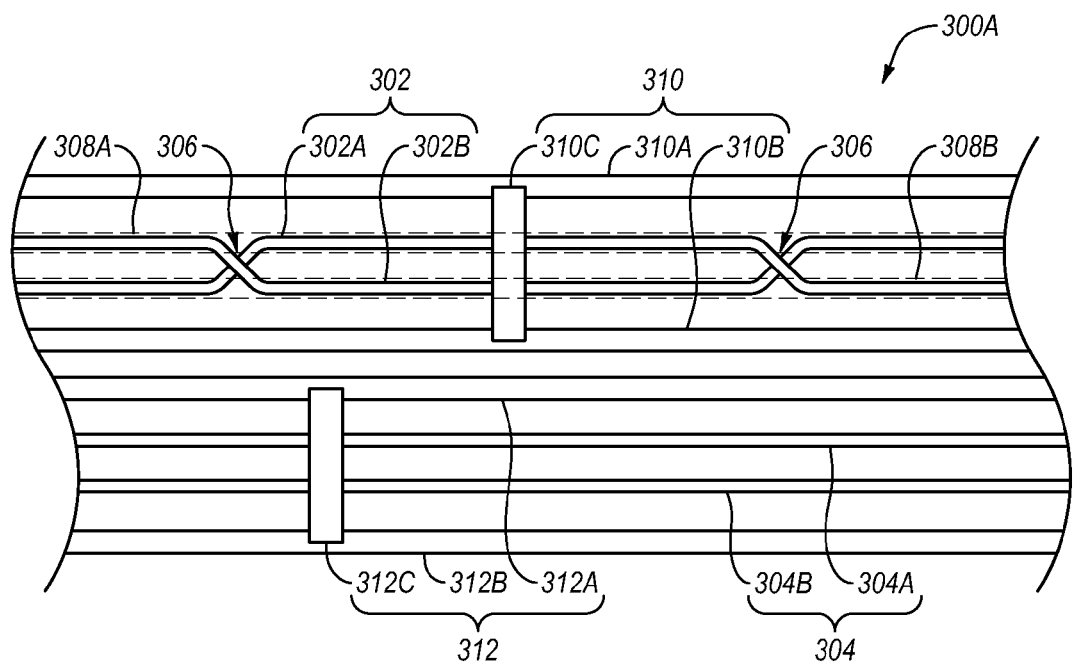
FIGS. 3A-3C illustrate various example apparatuses including multiple differential transmission lines with crossovers for isolation.
Figure 3B:
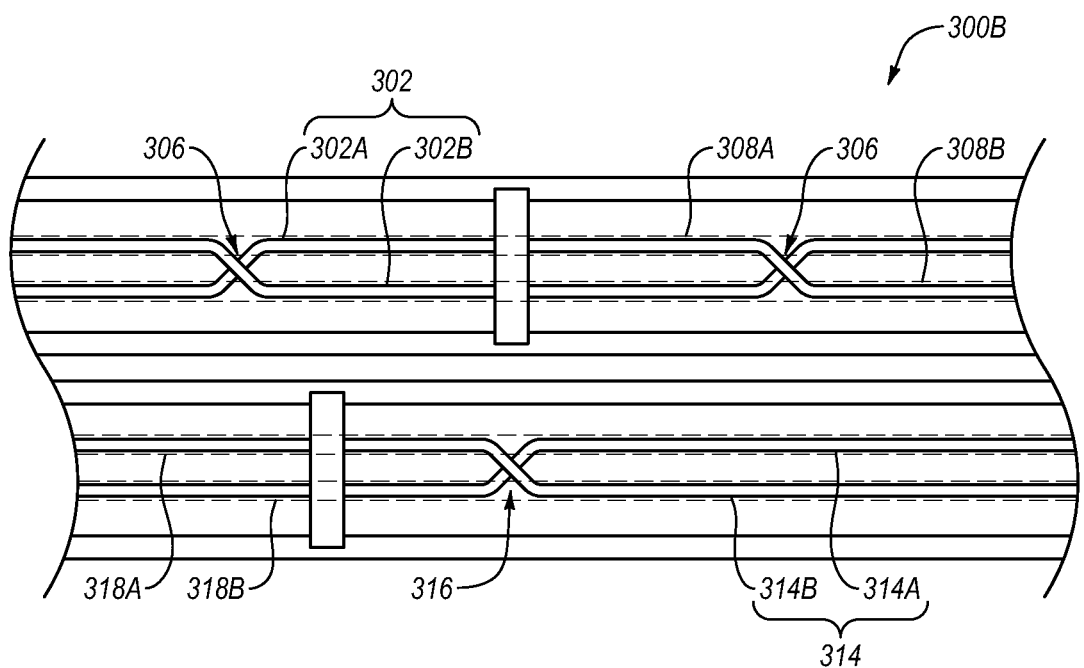
Figure 3C:
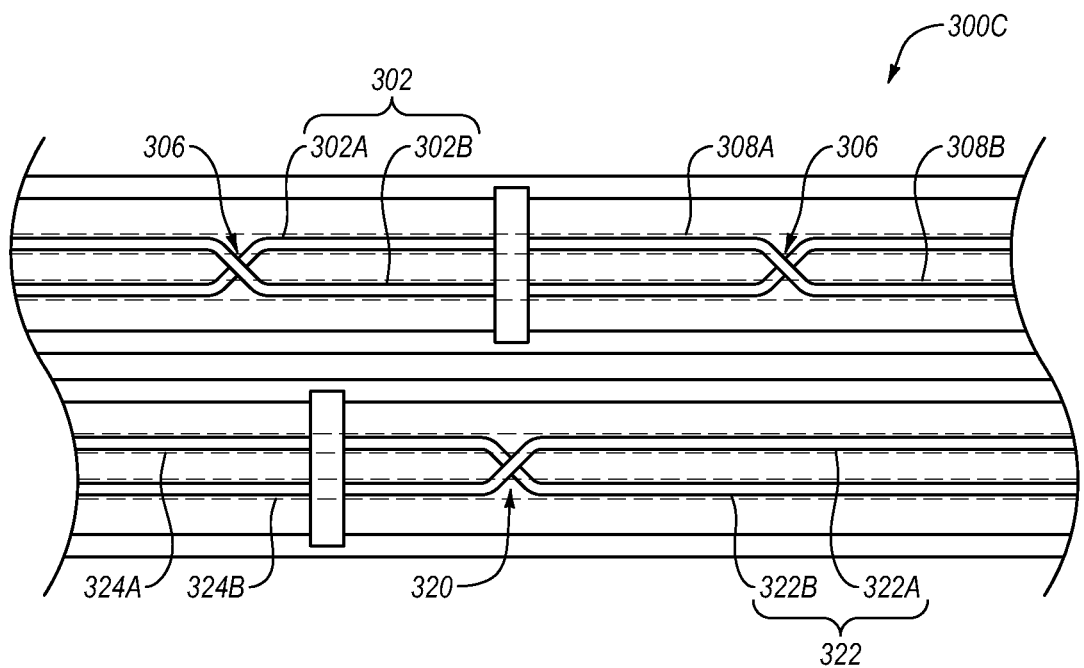

FIGS. 3A-3C illustrate various respective example apparatuses 300A, 300B, 300C (collectively "apparatuses 300") including multiple differential transmission lines with crossovers for isolation, arranged in accordance with at least some embodiments described herein. Each of the apparatuses 300 may be an integrated circuit (IC), a printed circuit board (PCB), or other apparatus with multiple transmission lines.

Alternately or additionally, each of the apparatuses 300 may be implemented in a system, such as the system 200 of FIG. 2.

The apparatus 300A of FIG. 3A includes differential transmission lines 302 and 304. The differential transmission line 302 includes first and second lines 302A and 302B. A differential signal carried by the differential transmission line 302 may include two components—e.g., one component carried on each of the first and second lines 302A and 302B—that are 180 degrees out of phase with each other. Similarly, the differential transmission line 304 includes first and second lines 304A and 304B, each carrying a corresponding component of a differential signal carried by the differential transmission line 304, the components being 180 degrees out of phase with each other. The lines 302A, 302B, 304A, 304B may each include a trace, a wire, or other conductor. Although not shown in FIG. 3A, each of the differential transmission lines 302, 304 may communicatively couple a differential transmission source to a differential transmission load.

Figure 8A:
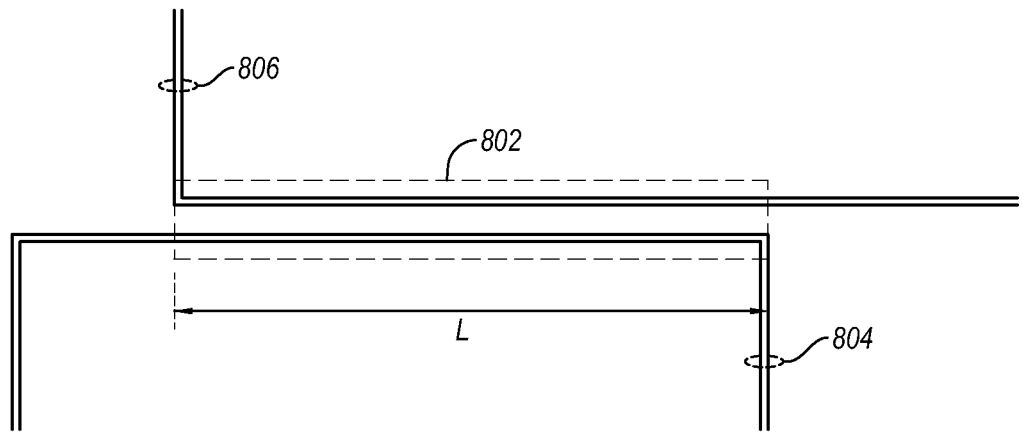
FIG. 8A illustrates an overlap region between two differential transmission lines.
Figure 8B:
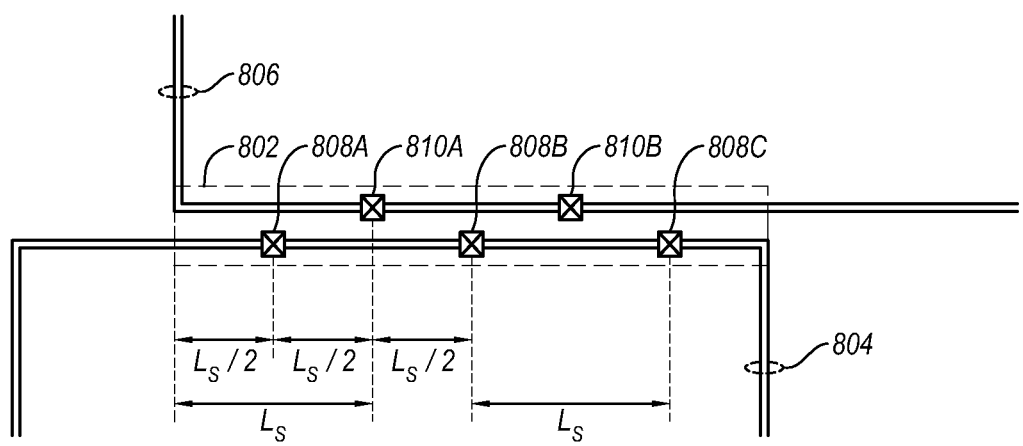
FIG. 8B illustrates example placement of crossovers in the two differential transmission lines of FIG. 8B for isolation.

The differential transmission line 304 is parallel to the differential transmission line 302 through an overlap region described in more detail with respect to FIGS. 8A-8B. According to some embodiments, the term "overlap region" refers to a region in which nearby differential transmission lines are parallel to each other. A length L (FIG. 8A) of the overlap regions refers to a length along either differential transmission line along which the differential transmission lines are parallel to each other.

Accordingly, in the embodiment of FIG. 3A, the apparatus 300A includes N crossovers 306 along the differential transmission line 302 through the overlap region at which the lines 302A, 302B switch lanes with each other. According to some embodiments, the term "lane" refers to a general pathway or route. In the example of FIG. 3A, the differential transmission line 302 includes two lanes: a first lane generally designated at 308A and a second lane generally designated at 308B. The first lane 308A and the second lane 308B are collectively referred to as "lanes 308." Except at the crossovers 306, the line 302A occupies a different lane 308 than the line 302A at any given location along the differential transmission line 302. For example, when the line 302A is in the first lane 308A (or the second lane 308B), the line 302B is in the second lane 308B (or the first lane 308A).

Moreover, because of the crossovers 306, each of the lines 302A, 302B occupies a different lane 308 at different locations along the differential transmission line 302. For example, at both the left side and the right side of FIG. 3A, the line 302A occupies the second lane 308B, whereas in the middle of FIG. 3A, the line 302A occupies the first lane 308A. Similarly, at both the left side and the right side of FIG. 3A, the line 302B occupies the first lane 308A, whereas in the middle of FIG. 3A, the line 302B occupies the second lane 308B.

The number N of crossovers 306 included in the differential transmission line 302 may be calculated according to equation 1:

$$N=1+\text{INT}\{L/(\lambda/C)\} \quad \text{(equation 1)}.$$

In equation 1, L is the length of the overlap region, $\lambda$ is a wavelength of the differential signal carried by the differential transmission line 302 or the differential transmission line 304 that has the highest frequency of the two differential signals, C is a constant, and INT is a well known integer function whereby INT $\{L/(\lambda/C)\}$ is $\{L/(\lambda/C)\}$ rounded down to the nearest integer.

In some embodiments, the constant C is in a range from 10 to 20. For instance, the constant C may be 10, 20, or any value therebetween. In these and other embodiments, the value of 10 may be used as the bottom limit for the constant C in view of the length of the corresponding differential transmission line being at least 1/10 of a wavelength of the differential signal carried by the corresponding differential transmission line. In some embodiments, the upper limit of the example range for the constant C may be 20 to limit insertion loss since the crossovers in RF applications are resistive. In other embodiments, such as in PCBs where crossovers may have negligible resistance, the constant C may have a value of at least 10 up to 20 or even higher.

In general, inclusion of N crossovers 306 in the differential transmission line 302 of FIG. 3A through the overlap region may improve isolation of the differential transmission lines 302, 304 compared to implementations in which no differential transmission line isolation scheme and/or one or more known differential transmission line isolation schemes are used.

Optionally, the apparatus 300A of FIG. 3A may additionally include a ground shield 310, 312 for the corresponding one of the differential transmission lines 302, 304. In more detail, the respective ground shield 310 for the differential transmission line 302 includes a first ground line 310A on one side of the differential transmission line 302, a second ground line 310B on the other side of the differential transmission line 302, and one or more conductive bridges 310C coupled to and configured to balance potential across the two ground lines 310A, 310B. The ground shield 312 for the differential transmission line 304 includes a first ground line 312A on one side of the differential transmission line 304, a second ground line 312B on the other side of the differential transmission line 304, and one or more conductive bridges 312C coupled to and configured to balance potential across the two ground lines.

With reference now to FIG. 3B, the apparatus 300B is similar in many respects to the apparatus 300A of FIG. 3A. For example, the apparatus 300B includes the differential transmission line 302 with crossovers 306 such that the lines 302A, 302B switch lanes 308A, 308B with each other at each crossover 306. Additionally, the apparatus 300B includes a differential transmission line 314 including N−1 crossovers 316 through an overlap region of the differential transmission line 302 and the differential transmission line 314 at which first and second lines 314A, 314B of the differential transmission line 314 switch lanes 318A, 318B (collectively "lanes 318") with each other. Each of the differential transmission lines 302, 314 additionally includes a ground shield as already described with respect to FIG. 3A.

In embodiments such as FIG. 3B where N crossovers 306 are provided in one differential transmission line, e.g., the differential transmission line 302, and N−1 crossovers 316 are provided in the other differential transmission line, e.g., the differential transmission line 314, the N−1 crossovers 316 may be interleaved with the N crossovers 306. In particular, each of the N−1 crossovers 316 may be located along the differential transmission line 314 at a corresponding location that, when projected normally onto the differential transmission line 302, is about at a midpoint between two adjacent ones of the N crossovers 306. Stated another way, each of the N−1 crossovers may be located along the differential transmission line 314 at a corresponding location that is about equidistant from a corresponding sequential pair of the N crossovers 306 of the differential transmission line 302.

In general, inclusion of N crossovers 306 and N−1 crossovers 316 in the respective differential transmission line 302 and the differential transmission line 314 as illustrated in FIG. 3B through the overlap region may improve isolation of the differential transmission lines 302, 314 even compared to implementations such as FIG. 3A in which crossovers are only provided in one of two parallel differential transmission lines.

In the embodiment of FIG. 3B, the N crossovers 306 in the differential transmission line 302 all cross over in the same direction. In particular, the line 302A or 302B in the first lane 308A crosses over the line 302B or 302A in the second lane 308B for each of the N crossovers 306. In FIG. 3B, the N−1 crossovers 316 in the differential transmission line 314 cross over in the same direction as the N crossovers 306.

Referring now to FIG. 3C, the apparatus 300C is similar in many respects to the apparatus 300B of FIG. 3B except that N−1 crossovers 320 included in a differential transmission line 322 mirror the N crossovers 306 included in the differential transmission line 302. In the illustrated embodiment of FIG. 3C, the differential transmission line 322 includes first and second lines 322A, 322B that switch between a first lane 324A and a second lane 324B (collectively "lanes 324") at each of the N−1 crossovers 320. However, the N−1 crossovers 320 mirror the N crossovers 306, meaning the N−1 crossovers 320 in the differential transmission line 322 all cross over in the opposite direction as the N crossovers 306 in the differential transmission line 302. In particular, whereas the line 302A or 302B in the first lane 308A crosses over the line 302B or 302A in the second lane 308B for each of the N crossovers 306, instead the line 322A or 322B in the second lane 324B crosses over the line 322B or 322A in the first lane 324A for each of the N−1 crossovers 320.

In general, inclusion of N crossovers 306 and N−1 crossovers 320 that mirror the N crossovers 306 in the differential transmission line 302 and the differential transmission line 322 as illustrated in FIG. 3C through a corresponding overlap region may improve isolation of the differential transmission lines 302, 322 even compared to implementations such as FIG. 3B in which N crossovers in one of the differential transmission lines and N−1 crossovers in the other of the differential transmission lines are in the same direction.

Modifications, additions, or omissions may be made to the apparatuses 300 without departing from the scope of the present disclosure, For example, one or both of the ground shields 310, 312 (FIG. 3A) may be omitted, or one of the ground lines 310B, 312A may be omitted and the remaining one of the ground lines 310B or 312A may be shared between the two ground shields 310, 312. As another example, while all of the N or N−1 crossovers in a given one of the differential transmission lines have been depicted as crossing over in the same direction, in other embodiments, some of the crossovers in a given differential transmission line may cross over in one direction while other crossovers in the same differential transmission line cross over in the opposite direction. As still another example, while N is illustrated as being two in FIGS. 3A-3C, more generally N may be any integer.

With combined reference to FIGS. 2 and 3A-3C, an example method of operating the system 200 will now be described. In the discussion that follows, it is assumed that the differential transmission line 202 is a first differential transmission line including the N crossovers 306 of FIGS. 3A-3C, and the differential transmission line 204 is a second differential transmission line that may or may not include N−1 crossovers as variously described with respect to FIGS. 3A-3C.

In operation, the differential transmission source 206 may drive a first differential signal having a first component and a second component on the differential transmission line 202, which includes both a first line and a second line that together make up the differential transmission line 202. The differential transmission line 202 may have, in an overlap region with the differential transmission line 204, N crossovers 306 at which the first line and the second line of the differential transmission line 202 switch lanes with each other.

Analogously, the differential transmission source 208 may drive a second differential signal having a first component and a second component on the differential transmission line 204, which includes both a first line and a second line. The differential transmission line 204 may be parallel to the differential transmission line 202 through the overlap region. The number of N crossovers 306 may satisfy equation 1.

The first component of the first differential signal may be carried on the first line of the differential transmission line 202 such that the first component of the first differential signal switches from the first lane 308A to the second lane 308B or from the second lane 308B to the first lane 308A at each of the N crossovers 306. Analogously, the second component of the first differential signal may be carried on the second line of the differential transmission line 202 such that the second component of the first differential signal switches from the second lane 308B to the first lane 308A or from the first lane 308A to the second lane 308B at each of the N crossovers 306. Where the differential transmission line 204 includes N−1 crossovers 316 or 320, the second differential signal may be carried on the first and second lines of the differential transmission line 204 in an analogous manner.

Figure 4A:
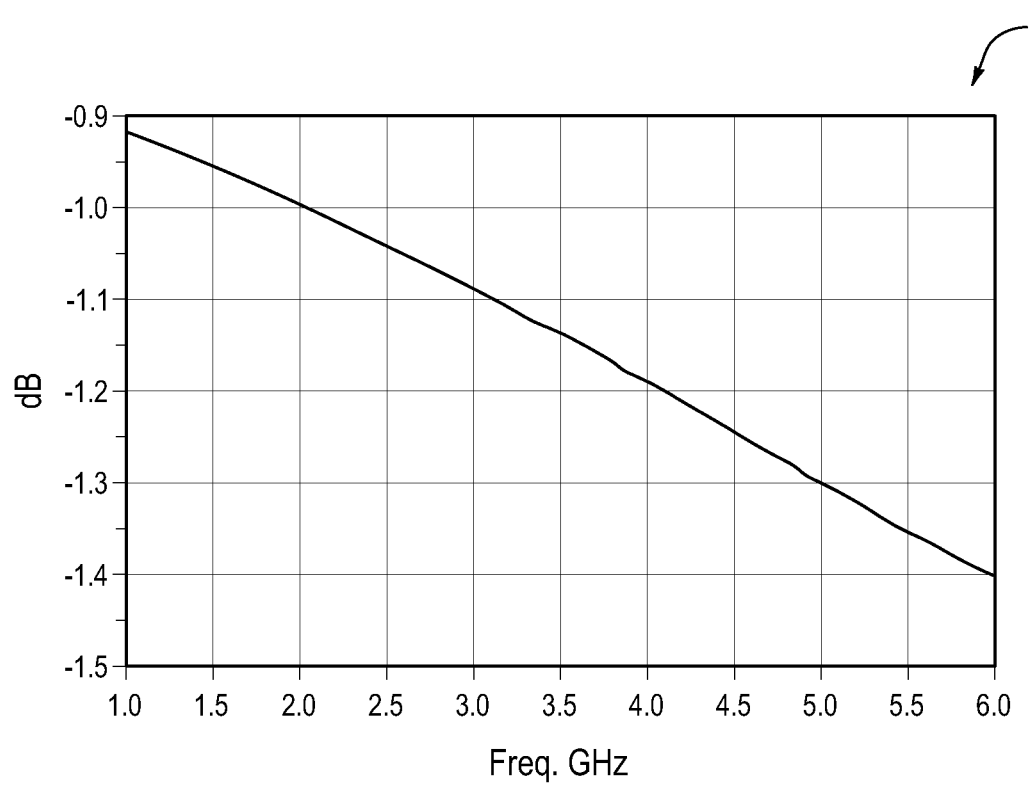
FIGS. 4A-4B include graphs comparing insertion loss of a first and second differential transmission line isolation scheme.
Figure 4B:
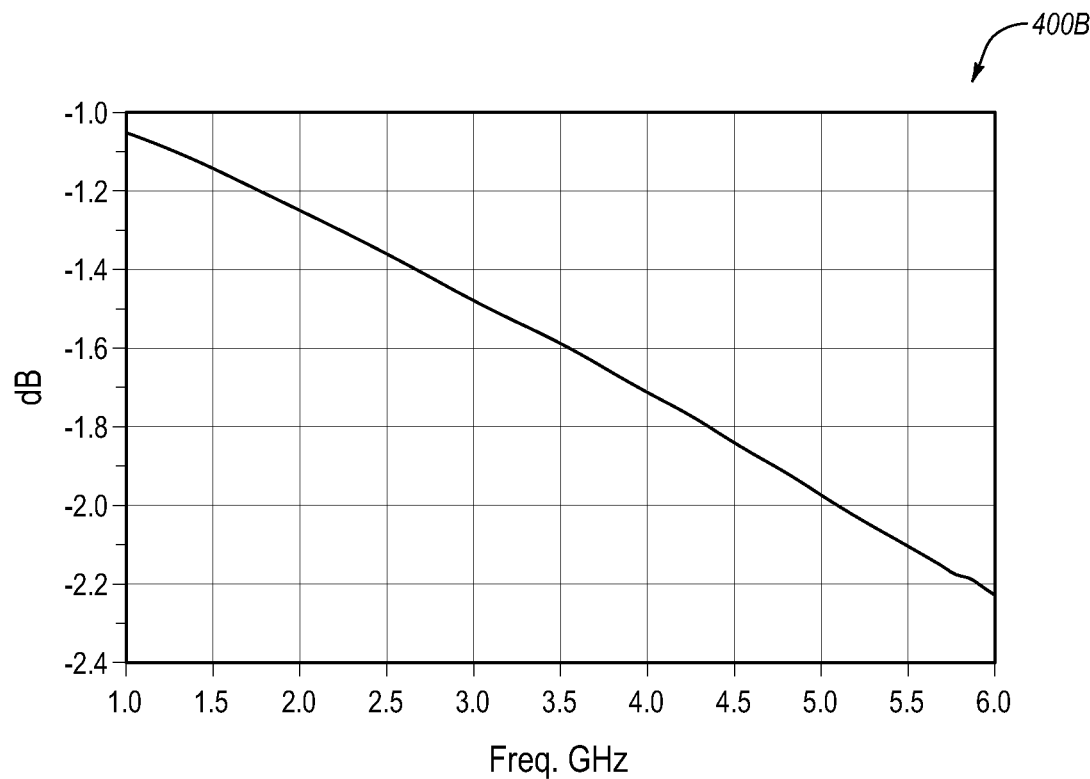

FIGS. 4A-4B include graphs 400A, 400B, respectively comparing insertion loss of a first and second differential transmission line isolation scheme (hereinafter "first isolation scheme" and "second isolation scheme"). The first isolation scheme includes ground shielding of each of two parallel differential transmission lines, as illustrated in FIG. 1. The second isolation scheme includes ground shielding of each of two parallel differential transmission lines and inclusion of N crossovers in one of the differential transmission lines and N−1 crossovers in the other of the differential transmission lines, as illustrated in FIG. 3B. Other than the difference in the applied isolation scheme, the two parallel differential transmission lines were otherwise configured the same for the measurements of FIGS. 4A and 4B.

As illustrated in both of FIGS. 4A and 4B, insertion loss_in dB increases as frequency in GHz of the differential signal increases. It may also be seen by comparing the graph 400B of FIG. 4B to the graph 400A of FIG. 4A that the insertion loss is marginally worse for the second isolation scheme associated with FIG. 4B as compared to the first isolation scheme associated with FIG. 4A. While the insertion loss is marginally worse for the second isolation scheme of FIG. 4B, the resulting isolation gains may be substantial enough in some embodiments to offset the marginally higher insertion loss.

Figure 5A:
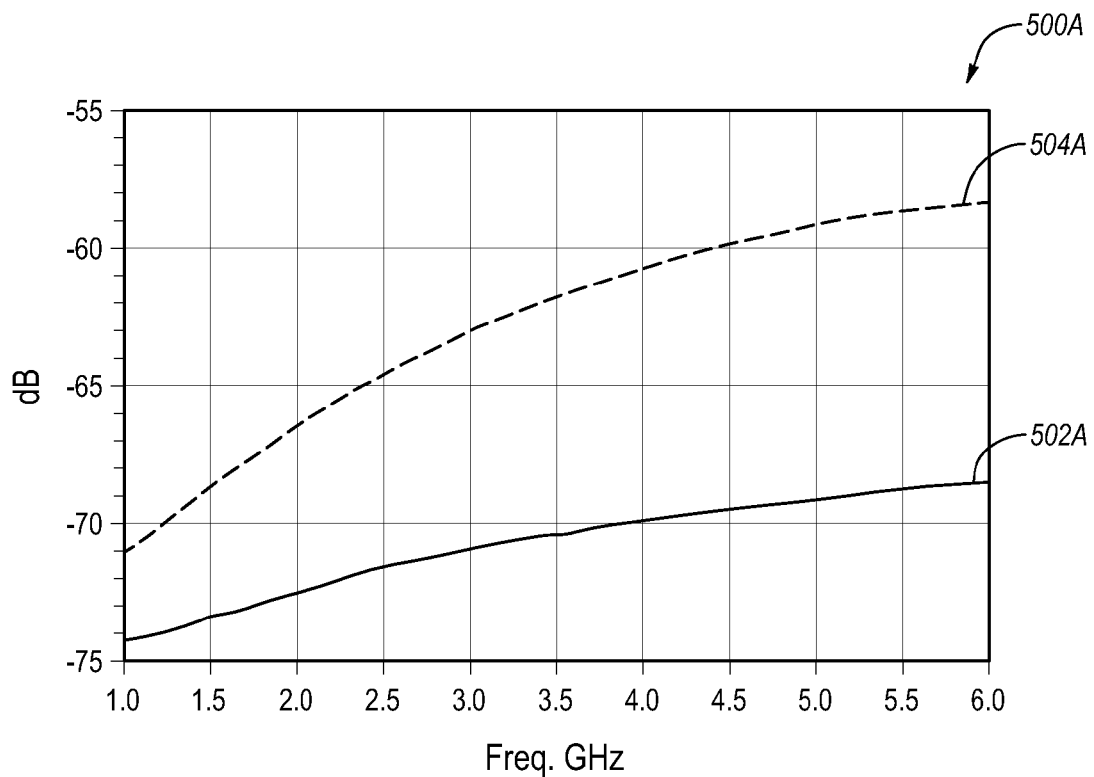
FIGS. 5A-5B include graphs comparing signal coupling of the first and second differential transmission line isolation schemes of FIGS. 4A-4B.
Figure 5B:
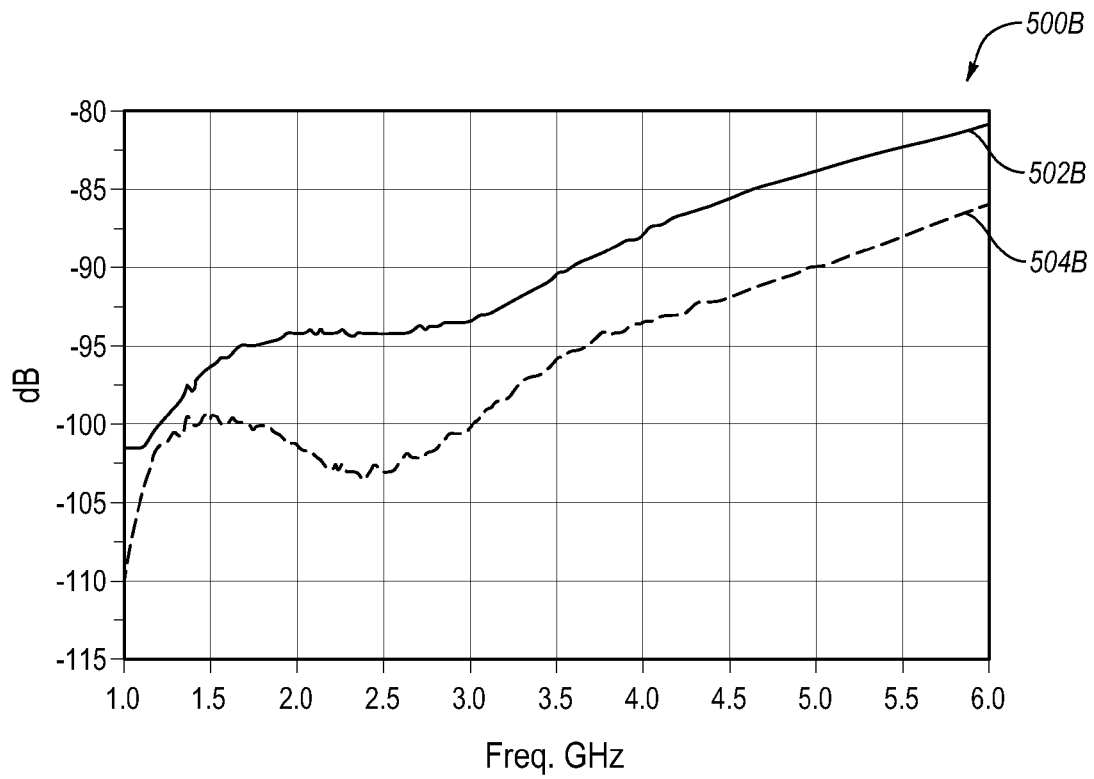

For example, FIGS. 5A-5B include graphs 500A, 500, respectively comparing signal coupling of the first and second isolation schemes of FIGS. 4A-4B. Each graph 500A, 500B, respectively includes a first curve 502A or 502B corresponding to forward coupling (hereinafter "forward coupling 502A" or "forward coupling 502B") and a second curve 504A or 504B corresponding to backward coupling (hereinafter "backward coupling 504A" or "backward coupling 504B"). It may be seen from comparing FIG. 5B to FIG. 5A that, at every frequency, the forward coupling 502B is lower (e.g., better isolation) for the second isolation scheme than the forward coupling 502A for the first isolation scheme, and that the backward coupling 504B is also lower for the second isolation scheme than the backward coupling 504A for the first isolation scheme. For example, at a frequency of 6 GHz, the backward coupling 504A for the first isolation scheme is about −58 decibels (dB), which is almost 30 dB higher than the value of about −86 dB for the backward coupling 504B of FIG. 5B at the same frequency.

Figure 6:
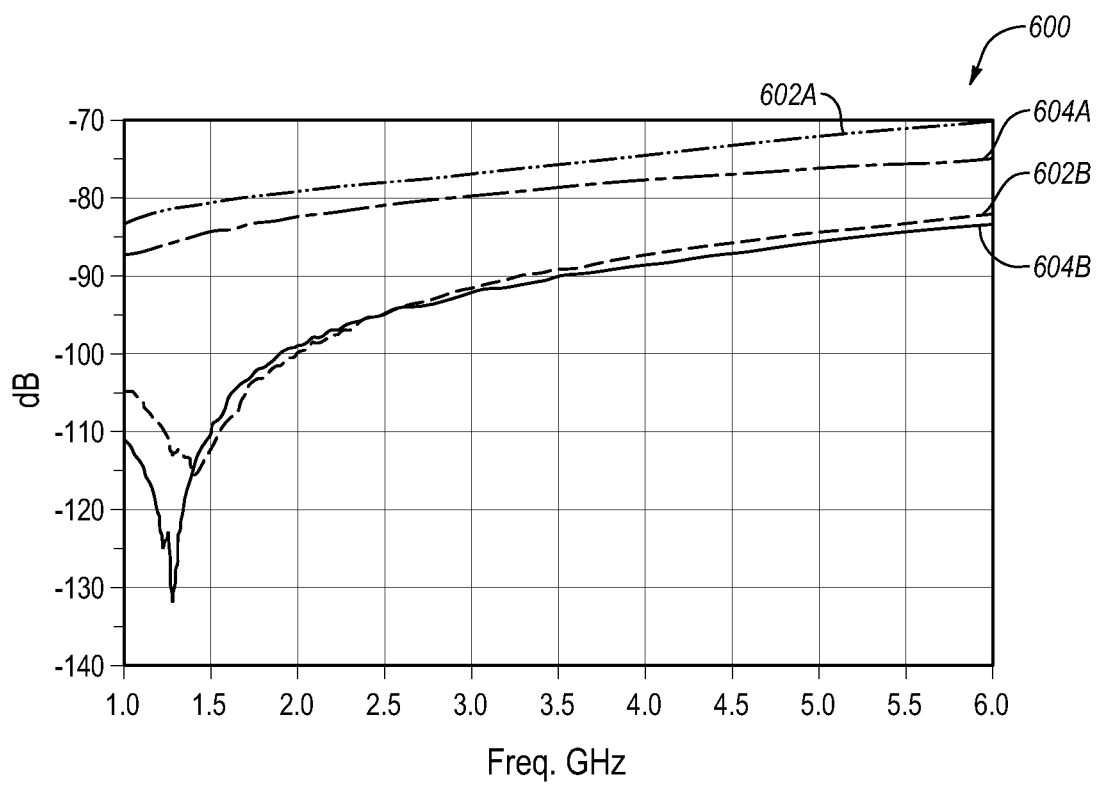
FIG. 6 is a graph comparing signal coupling of the second and a third differential transmission line isolation scheme.

FIG. 6 is a graph 600 comparing signal coupling of the second isolation scheme to a third differential transmission line isolation scheme (hereinafter "third isolation scheme"). The third isolation scheme includes ground shielding of each of two parallel differential transmission lines and inclusion of one or more randomly-placed crossovers in each of the differential transmission lines. Other than the difference in the applied isolation scheme, the two parallel differential transmission lines were otherwise configured the same for the measurements of FIG. 6. Moreover, for the second isolation scheme in the example of FIG. 6, each of the two differential transmission lines had crossovers at 1 mm spacing.

The graph 600 includes a first curve 602A corresponding to forward coupling for the third isolation scheme (hereinafter "forward coupling 602A"), a second curve 604A corresponding to backward coupling for the third isolation scheme (hereinafter "backward coupling 602B"), a third curve 602B corresponding to forward coupling for the second isolation scheme (hereinafter "forward coupling 602B"), and a fourth curve 604B corresponding to backward coupling for the second isolation scheme (hereinafter "backward coupling 604B").

It may be seen from FIG. 6 that the forward coupling 602B and the backward coupling 604B for the second isolation scheme are substantially improved, e.g., lower, compared to the forward coupling 602A and the backward coupling 604A for the third isolation scheme. Indeed, at 6 GHz, the isolation of the differential transmission lines is at least 12 dB better for the second isolation scheme than for the third isolation scheme for forward coupling and, at about 1.3 GHz, the isolation of the differential transmission lines is at least 45 dB better for the second isolation scheme than for the third isolation scheme for backward coupling.

Figure 7:
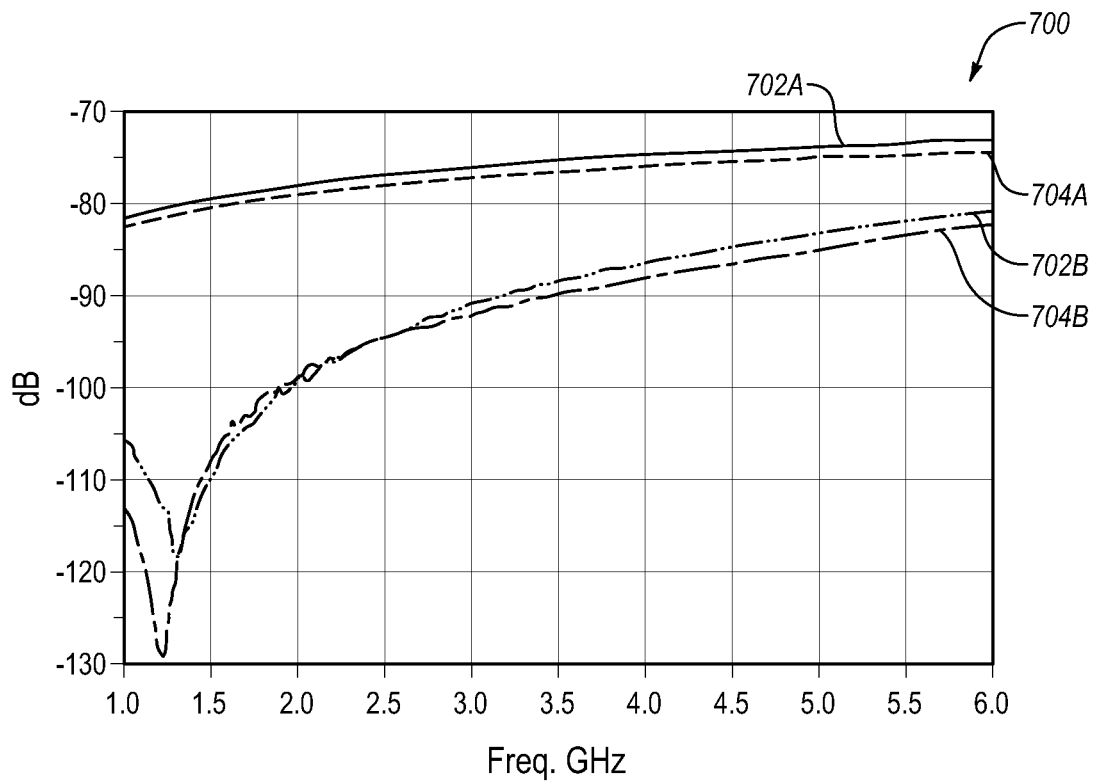
FIG. 7 is a graph comparing signal coupling of the second and a fourth differential transmission line isolation scheme.

FIG. 7 is a graph 700 comparing signal coupling of the second isolation scheme to a fourth differential transmission line isolation scheme (hereinafter "fourth isolation scheme"). The fourth isolation scheme includes ground shielding of each of two parallel differential transmission lines and inclusion of N crossovers in one of the differential transmission lines without any crossovers in the other one of the differential transmission lines, as illustrated in FIG. 3A. Other than the difference in the applied isolation scheme, the two parallel differential transmission lines were otherwise configured the same for the measurements of FIG. 7. Moreover, for the second isolation scheme in the example of FIG. 7, each of the two differential transmission lines had crossovers at 1 mm spacing.

The graph 700 includes a first curve 702A corresponding to forward coupling for the fourth isolation scheme (hereinafter "forward coupling 702A"), a second curve 704A corresponding to backward coupling for the fourth isolation scheme (hereinafter "backward coupling 702B"), a third curve 702B corresponding to forward coupling for the second isolation scheme (hereinafter "forward coupling 702B"), and a fourth curve 704B corresponding to backward coupling for the second isolation scheme (hereinafter "backward coupling 704B").

It may be seen from FIG. 7 that the forward coupling 702B and the backward coupling 704B for the second isolation scheme are substantially improved, e.g., lower, compared to the forward coupling 702A and the backward coupling 704A for the fourth isolation scheme. However, the forward coupling 702A and the backward coupling 704A for the fourth isolation scheme are nevertheless better than the first isolation scheme, as may be seen by comparing FIG. 7 to FIG. 5A.

FIG. 8A illustrates an overlap region 802 between two differential transmission lines 804, 806, arranged in accordance with at least one embodiment described herein. In the illustrated embodiment, the overlap region 802 has a length L. As already described above, the term "overlap region" refers to a region in which nearby differential transmission lines are parallel to each other. Thus, while each of the differential transmission lines 804, 806 may have a total length greater than L and/or may have various segments aligned in various directions, within the overlap region 802 for the length L the differential transmission lines 804, 806 may be nearby and parallel to each other.

To substantially reduce signal coupling and improve isolation between the differential transmission lines 804, 806, crossovers may be provided in one or both of the differential transmission lines 804, 806. For example, FIG. 8B illustrates example placement of crossovers 808A, 808B, 808C (collectively "crossovers 808") and 810A-810B (collectively "crossovers 810") in the two differential transmission lines 804, 806 of FIG. 8A for isolation, arranged in accordance with at least one embodiment described herein. In particular, N crossovers 808 are provided in the differential transmission line 804, and N−1 crossovers 810 are provided in the differential transmission line 806.

While the N crossovers 808 and the N−1 crossovers 810 are illustrated abstractly in FIG. 8B, they may generally be configured similar to the crossovers 306, 316, 320 of FIGS. 3A-3C. Moreover, the N−1 crossovers 810 may be arranged in the same direction as the N crossovers 808, or the N−1 crossovers 810 may mirror the N crossovers 808, or some of the N or N−1 crossovers 808, 810 within a given one of the differential transmission lines 804, 806 may be arranged in one direction while others are arranged in the opposite direction.

The number of N crossovers 808 may be determined according to, and may thus satisfy, equation 1 above. Accordingly, a length $L_s$ of each crossover-to-crossover section may be about equal to the length L of the overlap region 802 divided by N, or $L_s = L/N$. For example, the length of the segment from crossover 808B to crossover 808C may be about equal to $L_s$. Similarly, the length of the segment from crossover 808A to crossover 808B and of the segment from crossover 810A to crossover 810B may be about equal to $L_s$. In the differential transmission line 806 with the N−1 crossovers 810, the two end-to-crossover segments from one end of the overlap region 802 to the crossover 810A and from the crossover 810B to the other end of the overlap region 802 may also be about equal to $L_s$. In the differential transmission line 804 with the N crossovers 808, the two end-to-crossover segments from one end of the overlap region 802 to the crossover 808A and from the crossover 808C to the other end of the overlap region 802 may be about equal to $L_s/2$.

FIG. 8B further illustrates the interleaving of the N−1 crossovers 810 with the N crossovers 808 such that each of the N−1 crossovers 810 is located along the differential transmission line 806 at a corresponding location that, when projected normally onto the differential transmission line 804, is about at a midpoint between two adjacent ones of the N crossovers 808. For example, as illustrated in FIG. 8B, when projected normally onto the differential transmission line 804, the crossover 810A is about at a midpoint between the adjacent crossovers 808A and 808B, which is a distance of $L_s/2$ from each of the crossovers 808A and 808B. Accordingly, the crossover 810A is also equidistant from the crossovers 808A and 808B. Similarly, the crossover 810B is equidistant from the crossovers 808B and 808C.

Some embodiments disclosed herein may include designing an apparatus with multiple differential transmission lines, including determining, according to equation 1, a number of N crossovers to include in a first differential transmission line that is parallel to a second differential transmission in an overlap region of length L. Designing the apparatus may also include determining locations of the N crossovers, and/or of N−1 crossovers included in the second differential transmission line. In particular, the length $L_s$ of each crossover-to-crossover segment may be determined as being equal to L/N, and the first crossover along the first differential transmission line may be provided at a distance of $L_s/2$ from a first end of the overlap region, with the other crossovers being provided along the first differential transmission line at intervals of $L_s$ from the previous crossover. Analogously, the first crossover along the second differential transmission line may be provided at a distance of $L_s$ from the first end of the overlap region, with the other crossovers being provided along the second differential transmission line at intervals of $L_s$ from the previous crossover such that the N−1 crossovers in the second differential transmission line are interleaved with the N crossovers in the first differential transmission line.

Figure 9:
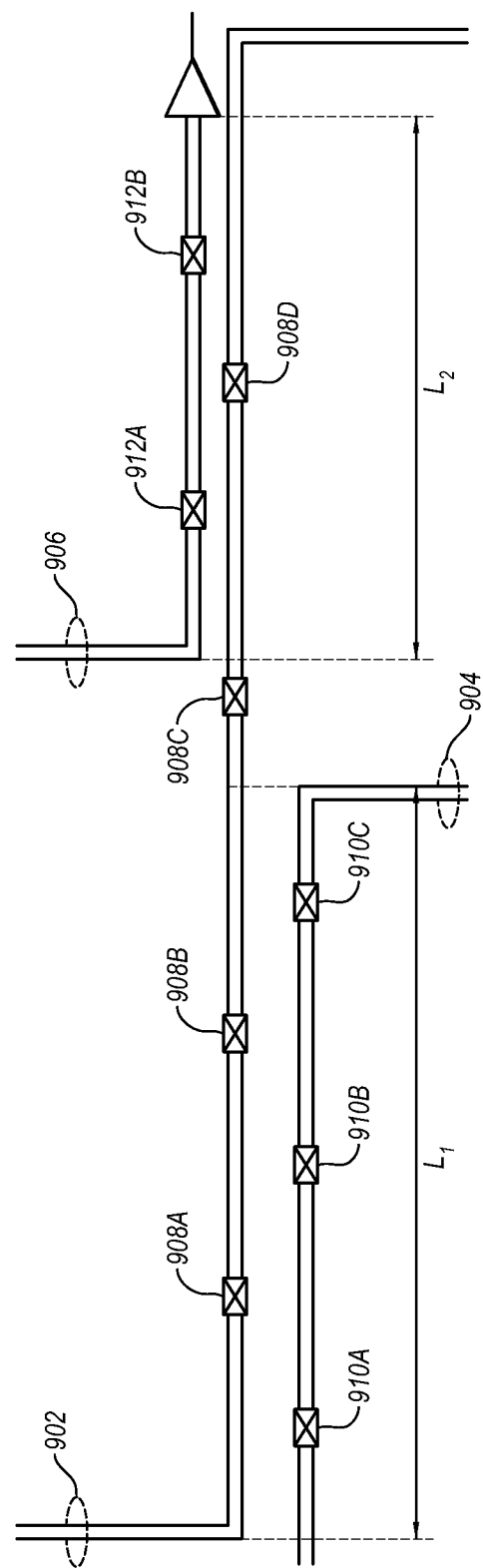
FIG. 9 illustrates three differential transmission lines with crossovers for isolation.

Embodiments described above include two differential transmission lines that are parallel at least through an overlap region. The principles described in the above embodiments are equally applicable to three or more differential transmission lines that are parallel to each other at least through one or more overlap regions. For example, FIG. 9 illustrates three differential transmission lines 902, 904, 906 with crossovers 908A, 908B, 908C, 908D (collectively "crossovers 908"), 910A, 910B, 910C (collectively "crossovers 910"), and 912A-912B (collectively "crossovers 912") for isolation, arranged in accordance with at least one embodiment described herein.

In the illustrated embodiment, the differential transmission line 902 is parallel to the differential transmission line 904 through a first overlap region of length $L_1$, and is also parallel to the differential transmission line 906 through a second overlap region of length $L_2$. As such, and within the first overlap region, $N_1$ crossovers 910 are provided in the differential transmission line 904 according to equation 1, and $N_1-1$ crossovers 908A, 908B are provided in the differential transmission line 902. Additionally, within the second overlap region, $N_2$ crossovers 912 are provided in the differential transmission line 906 according to equation 1, and $N_2-1$ crossovers 908D are provided in the differential transmission line 902.

Alternately or additionally, one or more crossovers may be placed outside of any overlap regions in one or more of the differential transmission lines 902, 904, 906 to improve isolation from other structures, circuitries, or the like. For instance, the crossover 908C provided in the differential transmission line 902 is outside either of the first or second overlap regions.

All examples and conditional language recited herein are intended for pedagogical objects to aid the reader in understanding the invention and the concepts contributed by the inventor to furthering the art, and are to be construed as being without limitation to such specifically-recited examples and conditions. Although embodiments of the present inventions have been described in detail, it should be understood that the various changes, substitutions, and alterations could be made hereto without departing from the spirit and scope of the invention.

What is claimed is:

1. An apparatus comprising:
 a first differential transmission line configured to carry a first differential signal;
 a second differential transmission line, parallel to the first differential transmission line to define an overlap region there between, and configured to carry a second differential signal;
 wherein:
  the first differential transmission line includes a first line and a second line;
  the first differential transmission line includes N crossovers along the first differential transmission line through the overlap region at which the first line and the second line switch lanes with each other; and
  N is equal to 1+INT {L/(λ/C)}, where L is a length of the overlap region, κ is a wavelength of the first differential signal or a wavelength of the second differential signal having the highest frequency of the first differential signal or the second differential signal, C is a number in a range from 10 to 20, and INT {L/(λ/C)} is {L/(λ/C)} rounded down to the nearest integer.

2. The apparatus of claim 1, wherein:
 the first differential transmission line has a length greater than one-tenth of the wavelength of the first differential signal; and
 the second differential transmission line has a length greater than one-tenth of the wavelength of the second differential signal.

3. The apparatus of claim 2, wherein the length of the first differential transmission line and the length of the second differential transmission line are each in a range from 1.3 millimeters to 22 millimeters.

4. The apparatus of claim 1, wherein each of the first differential transmission line and the second differential transmission line is configured to carry a corresponding signal having a frequency in a range from about 900 Megahertz (MHz) to about 15 gigahertz (GHz).

5. The apparatus of claim 1, wherein:
 the second differential transmission line includes a first line and a second line;
 the second differential transmission line includes N−1 crossovers at which the first line and the second line of the second differential transmission line switch lanes with each other.

6. The apparatus of claim 5, wherein each of the N−1 crossovers of the second differential transmission line is located along the second differential transmission line at a corresponding location that is about equidistant between two of the N crossovers in a corresponding sequential pair of the N crossovers of the first differential transmission line.

7. The apparatus of claim 5, wherein:
 the lanes of first differential transmission line includes first and second lanes;
 the second differential transmission line includes first and second lanes; and
 the first and second lanes of the first differential transmission line and the first and second lanes of the second differential transmission line are parallel and arranged in order from the first lane of the first differential transmission line to the second lane of the first differential transmission line to the first lane of the second differential transmission line to the second lane of the second differential transmission line; and
 the N−1 crossovers of the second differential transmission line mirror the N crossovers of the first differential transmission line such that:

if each of the N crossovers in the first differential transmission line includes a line in the first lane of the first differential transmission line crossing over a line in the second lane of the first differential transmission line, then each of the N−1 crossovers in the second differential transmission line includes a line in the second lane of the second differential transmission line crossing over a line in the first lane of the second differential transmission line; or if each of the N crossovers in the first differential transmission line includes a line in the second lane of the first differential transmission line crossing over a line in the first lane of the first differential transmission line, then each of the N−1 crossovers in the second differential transmission line includes a line in the first lane of the second differential transmission line crossing over a line in the second lane of the second differential transmission line.

8. A method of operating a system having a plurality of differential transmission lines, the method comprising:

driving a first differential signal having a first component and a second component on a first differential transmission line including a first line and a second line, the first differential transmission line having N crossovers at which the first line and the second line of the first differential transmission line switch lanes with each other; and driving a second differential signal having a first component and a second component on a second differential transmission line including a first line and a second line, wherein the second differential transmission line is parallel to the first differential transmission line through an overlap region;

wherein N is equal to 1+INT $\{L/(\lambda/C)\}$, where L is the length of the overlap region, $\lambda$ is a wavelength of the first differential signal or a wavelength of the second differential signal having the highest frequency of the first differential signal or the second differential signal, C is a number in a range from 10 to 20, and INT $\{L/(\lambda/C)\}$ is $\{L/(\lambda/C)\}$ rounded down to the nearest integer.

9. The method of claim 8, wherein each of the first differential signal and the second differential signal has a frequency in a range from about 900 Megahertz (MHz) to about 15 gigahertz (GHz).

10. The method of claim 8, further comprising:

carrying the first component of the first differential signal on the first line of the first differential transmission line such that the first component of the first differential signal switches lanes from a first lane to a second lane or from the second lane to the first lane at each of the N crossovers; and carrying the second component of the first differential signal on the second line of the first differential transmission line such that the second component of the first differential signal switches lanes from the second lane to the first lane or from the first lane to the second lane at each of the N crossovers.

11. The method of claim 8, wherein the second differential transmission line has, in the overlap region, N−1 crossovers at which the first line and the second line of the second differential transmission line switch lanes with each other.

12. The method of claim 11, wherein:

a first one of the N crossovers of the first differential transmission line is positioned along the first differential transmission line at a distance of about (L/N)/2 from an end of the overlap region;

the N crossovers of the first differential transmission line are spaced along the first differential transmission line at a spacing of about L/N beginning from the first one of the N crossovers;

a first one of the N−1 crossovers of the second differential transmission line is positioned along the second differential transmission line at a distance of about L/N from the end of the overlap region; and the N−1 crossovers of the second differential transmission line are spaced along the second differential transmission line at a spacing of about L/N beginning from the first one of the N−1 crossovers.

13. The method of claim 11, wherein:

the lanes of the first differential transmission line include a first lane and a second lane;

the lanes of the second differential transmission line include a first lane and a second lane;

within the overlap region, the lanes are parallel and arranged in order from the first lane of the first differential transmission line to the second lane of the first differential transmission line to the first lane of the second differential transmission line to the second lane of the second differential transmission line; and the N−1 crossovers of the second differential transmission line mirror the N crossovers of the first differential transmission line such that:

if each of the N crossovers in the first differential transmission line includes a line in the first lane of the first differential transmission line crossing over a line in the second lane of the first differential transmission line, then each of the N−1 crossovers in the second differential transmission line includes a line in the second lane of the second differential transmission line crossing over a line in the first lane of the second differential transmission line; or if each of the N crossovers in the first differential transmission line includes a line in the second lane of the first differential transmission line crossing over a line in the first lane of the first differential transmission line, then each of the N−1 crossovers in the second differential transmission line includes a line in the first lane of the second differential transmission line crossing over a line in the second lane of the second differential transmission line.

14. The method of claim 8, wherein:

the first differential transmission line has a length greater than one-tenth of the wavelength of the first differential signal; and the second differential transmission line has a length greater than one-tenth of the wavelength of the second differential signal.

15. The method of claim 14, wherein the length of the first differential transmission line and the length of the second differential transmission line are each in a range from 1.3 millimeters to 22 millimeters.

16. A system comprising:

a first differential transmission source;

a first differential transmission load;

a first differential transmission line communicatively coupling the first differential transmission source to the first differential transmission load and configured to carry a first differential signal;

a second differential transmission source;

a second differential transmission load;

a second differential transmission communicatively coupling the second differential transmission source to the second differential transmission load and configured to carry a second differential signal, the second differential transmission line being parallel to the first differential transmission line through an overlap region;
wherein:
the first differential transmission line includes a first line and a second line;
the first differential transmission line includes N crossovers along the first differential transmission line through the overlap region at which the first line and the second line switch lanes with each other; and
N is equal to 1+INT $\{L/(\lambda/C)\}$, where L is a length of the overlap region, κ is a wavelength of the first differential signal or the second differential signal having the highest frequency of the first differential signal or the second differential signal, C is a number in a range from 10 to 20, and INT $\{L/(\lambda/C)\}$ is $\{L/(\lambda/C)\}$ rounded down to the nearest integer.

17. The system of claim 16, wherein:
the first differential transmission source comprises a first local oscillator;
the first differential transmission load comprises a first transmitter/receive mixer;
the second differential transmission source comprises a second local oscillator; and
the second differential transmission load comprises a second transmitter/receive mixer.

18. The system of claim 16, wherein:
the second differential transmission line includes a first line and a second line;
the second differential transmission line includes N−1 crossovers at which the first line and the second line of the second differential transmission line switch lanes with each other.

* * * * *